US008013854B2

(12) United States Patent
Delarue et al.

(10) Patent No.: US 8,013,854 B2
(45) Date of Patent: Sep. 6, 2011

(54) PROCESS FOR DISPLAYING OBJECTS OF A PLM DATABASE AND APPARATUS IMPLEMENTING THIS PROCESS

(75) Inventors: Guillaume Delarue, Courbevoic (FR); Arnaud Nonclercq, Suresnes (FR)

(73) Assignee: Dassault Systemes, Suresnes Cedex (FR)

( * ) Notice: Subject to any disclaimer, the term of this patent is extended or adjusted under 35 U.S.C. 154(b) by 596 days.

(21) Appl. No.: 11/646,979

(22) Filed: Dec. 28, 2006

(65) Prior Publication Data

US 2007/0168392 A1 Jul. 19, 2007

(51) Int. Cl.
*G06T 17/00* (2006.01)
(52) U.S. Cl. .......................................... 345/420; 703/1
(58) Field of Classification Search .................. 345/420; 703/1
See application file for complete search history.

(56) References Cited

U.S. PATENT DOCUMENTS

| | | | | |
|---|---|---|---|---|
| 5,202,671 | A * | 4/1993 | Aranda et al. ................ | 345/642 |
| 5,982,382 | A | 11/1999 | Benzel et al. | |
| 6,055,328 | A * | 4/2000 | Li ............................... | 382/145 |
| 6,057,847 | A * | 5/2000 | Jenkins ....................... | 345/422 |
| 6,219,055 | B1 | 4/2001 | Bhargava et al. | |
| 6,314,205 | B1 * | 11/2001 | Masuda et al. ............... | 382/232 |
| 6,377,257 | B1 * | 4/2002 | Borrel et al. ................. | 345/419 |
| 6,750,859 | B2 * | 6/2004 | Sowizral et al. ............. | 345/418 |
| 6,918,121 | B2 * | 7/2005 | Stejskal et al. ............... | 719/315 |
| 7,196,702 | B1 * | 3/2007 | Lee et al. ..................... | 345/419 |
| 2002/1075257 | | 6/2002 | Chartier et al. | |
| 2005/0055181 | A1 * | 3/2005 | Verdura et al. ............... | 703/1 |
| 2005/0080502 | A1 * | 4/2005 | Chernyak et al. ............ | 700/97 |
| 2005/0223337 | A1 | 10/2005 | Wheeler et al. | |
| 2005/1243084 | | 11/2005 | Smith et al. | |

FOREIGN PATENT DOCUMENTS

| | | |
|---|---|---|
| EP | 0 439 260 A2 | 7/1991 |
| WO | WO-00/04433 A2 | 1/2000 |

OTHER PUBLICATIONS

Zhang, C., et al., "Spatio-Temporal Issues in Infrastructure Lifecycle Management Systems", $1^{st}$ CSCE Specialty Conference on Infrastructure Technologies, Management and Policy, Jun. 2, 2005, pp. 131-1-131-10.
Kelleghan, Mike, "Octree Partitioning Techniques", Aug. 1997, http://www.gamasutra.com/features/19970807/octree.html.
Ding, S., et al "Oriented bounding box and octree based global interference detection in 5-axis machining of free-form surfaces", Computer-Aided Design, Nov. 2004, vol. 36, No. 13, pp. 1281-1294.

(Continued)

*Primary Examiner* — Xiao Wu
*Assistant Examiner* — Charles Tseng
(74) *Attorney, Agent, or Firm* — Baker & Hostetler LLP

(57) ABSTRACT

The invention is directed to an apparatus, a computer program and a process for displaying objects of a PLM database, including the steps of providing a PLM database containing modeled objects and a graphical user interface (100), identifying (S200) a viewpoint on a view (110) of objects (21-24) to be rendered; and rendering (S210-270) said view according to the viewpoint, wherein the step of rendering includes determining (S210) a plurality of locations (32*a-i*) in the view, searching the database and identifying therein modeled objects according to the determined locations, and incrementally displaying (S220-S270) in the graphical user interface the modeled objects identified so as to rendering said view.

17 Claims, 7 Drawing Sheets

OTHER PUBLICATIONS

Tan, Tiow-Seng, et al., "Computer Bounding Volume Hierarchies Using Model Simplification", Proceedings of the 1999 Symposium on Interactive 3D Graphics, Atlanta, GA, Apr. 26-28, 1999, pp. 63-69.

Arvo, James, et al., "Chapter 6: A Survey of Ray Tracing Acceleration Techniques", An Introduction to Ray Tracing, 1989, pp. 201-263.

Stork, A., "Interfacing to a CSG history graph", Proceedings of CSG Set-Theoretic Solid Modelling: Techniques and Applications, Apr. 17, 1996, pp. 201-214.

"SolidWorks, Modifying Parts", Oct. 25, 2003, http://web.archive.org/web/20031025071553/http://www.me.cmu.edu/academics/courses/NSF_Edu Proj/Statics_Solidworks/MODIFY.htm.

Grecu, Dan, et al., "Distributed Constraint Management as a Basis for Team Design", Computer Supported Cooperative Work in Design, 2002, The 7th International Conference on Sep. 25, 2002, Piscataway, NJ, pp. 355-360.

* cited by examiner

PROCESS FOR DISPLAYING OBJECTS OF A PLM DATABASE AND APPARATUS IMPLEMENTING THIS PROCESS

RELATED APPLICATIONS

This application claims priorty to European Application Nos. 05028721.8 filed Dec. 30, 2005, 05028720.0 filed Dec. 30, 2005 and 06291228.2 filed Jul. 28, 2006.

FIELD OF THE INVENTION

The invention relates to the field of computer-implemented methods and systems, and more specifically to product life cycle management solutions, which comprise databases of data representative of modeled objects.

BACKGROUND OF THE INVENTION

A number of systems and solutions are offered on the market for the design of parts or assemblies of parts, such as the one provided by DASSAULT SYSTEMES under the trademark CATIA. These so-called computer-aided design (CAD) systems allow a user to construct, manipulate and view complex three-dimensional (3D) models of objects or assemblies of objects. CAD systems provide a representation of modeled objects using edges or lines, in certain cases with faces. Lines or edges may be represented in various manners, e.g. non-uniform rational B-splines (NURBS). These CAD systems manage parts or assemblies of parts as modeled objects, which are essentially specifications of geometry. Specifically, CAD files contain specifications, from which a geometry is generated, and from geometry a representation is generated. Specifications, geometry and representation may be stored in a single CAD file or multiple ones. CAD systems include graphic tools for representing the modeled objects to the designers; these tools are dedicated to the display of complex objects—the typical size of a file representing an object in a CAD system being in the range of a Mega-byte for part, and an assembly may comprise thousands of parts. A CAD system manages models of objects, which are stored in electronic files.

There also exists product life cycle management (PLM) solutions, such as the suite of products provided by DASSAULT SYSTEMES under the trademarks CATIA, ENOVIA and DELMIA; these solutions provide an engineering hub, which organizes product engineering knowledge, a manufacturing hub, which manages manufacturing engineering knowledge, and an enterprise hub which enables enterprise integrations and connections into both the engineering and manufacturing hubs. All together the systems delivers an open object model linking products, processes, resources to enable dynamic, knowledge-based product creation and decision support that drives optimized product definition, manufacturing preparation, production and service.

Such PLM solutions comprise a relational database of products. A database is usually defined as a collection of data (typically data and relations between the data) organized for rapid search and retrieval. Databases are structured to facilitate storage, retrieval, modification, and deletion of data in conjunction with various data-processing operations. Databases generally consists of a file or set of files that can be broken down into records, each of which consist of one or more fields. Fields are the basic units of data storage. Users retrieve database information primarily through queries. Using keywords and sorting commands, users can search, rearrange, group, and select the field in many records to retrieve or create reports on particular aggregates of data according to the rules of the database management system being used.

Using PLM solutions, a basic need of a user is to visualize a complex product made of thousand objects/parts and this, possibly according to different views or different viewpoints (virtual camera). The user may notably modify the viewpoint while viewing the modeled product being displayed. The user may also wish to select a given part to edit it (that is, possibly modify it), etc.

The standard solution to this problem is to load in the client computer memory the whole model corresponding to the assembly of said objects, including a three dimensional graphic representation of the model and all the information on said objects such as geometry, constraints . . . , but also hyperlinks to other objects. Thus, selection of individual parts is possible. However, in the field of PLM/CAD, the critical problem is that the global amount of visualization data is too large to fit in memory or at least too large for enabling a rapid display. Thus, due to the typical size of a file representing a CAD product (a product such as an airplane is likely to contain millions of parts, representing several giga-octets of memory), the rendering time of a view of said product may be cripplingly long.

There is therefore a need for a solution enabling an efficient display of a CAD product comprising a number of parts. Preferably, the solution should allow for navigating in large 3D PLM data with reduced Input/output (I/O) and memory consumption.

SUMMARY OF THE INVENTION

The invention provides processes, an apparatus and a computer program for displaying objects of a PLM database that address the above stated needs.

In one embodiment, the invention therefore provides a process for displaying objects of a PLM database, comprising:
  providing a PLM database containing modeled objects and a graphical user interface;
  identifying a viewpoint on a view of objects to be rendered; and
  rendering said view according to the viewpoint,
  wherein the step of rendering comprises:
    determining a plurality of locations in the view;
    searching the database and identifying therein modeled objects according to the determined locations, and
    incrementally displaying in the graphical user interface the modeled objects identified so as to render said view.

In other embodiments, the process according to the invention may comprise one or more of the following features:
  the process according to the invention, further comprises, before the step of identifying the viewpoint, a step of receiving dynamical definition of the viewpoint by a user, and wherein the step of determining the plurality of locations is performed dynamically, according to the user definition of the viewpoint;
  the locations are determined from a grid defined in the view;
  the step of determining the plurality of locations comprises refining said grid with time;
  the PLM database further comprises display components of the modeled objects, and wherein the step of rendering further comprises streaming display components of the modeled objects identified, and wherein, at the step of rendering, the step of incrementally displaying comprises incrementally displaying the display components;
the steps of identifying modeled objects and incrementally displaying are performed alternatively on a time basis;
the step of rendering further comprises establishing a ranking of objects identified at the step of identifying modeled objects, and the step of incrementally displaying the modeled objects is performed according to said ranking;
the process according to the invention, further comprises, parallel to the step of searching the database and identifying modeled objects, a step of identifying in the database a list of modeled objects visible in said view according to the viewpoint, the step of incrementally displaying comprising displaying the modeled objects identified according to the determined locations and completing the display of the modeled objects according to the list;
the step of searching the database and identifying modeled objects further comprises computing a ray passing through the viewpoint and at least one of the locations defined;
the step of searching and identifying further comprises identifying one or more bounding volume of a respective modeled object intersecting the computed ray;
the process according to the invention, further comprises identifying, amongst the objects corresponding to intersecting bounding volumes, the object the closest to the viewpoint;
the process according to the invention, further comprises, prior to the step of searching the database, a step of computing and storing in the PLM database bounding volumes of respective modeled objects;
at the step of computing and storing bounding volumes, only one bounding volume is stored for multi-instantiated objects of the modeled objects;
the step of identifying one or more intersecting bounding volume is carried out recursively, based on relations stored in the database between the respective objects;
the process according to the invention, further comprises, prior to the step of searching the database computing and storing in the PLM database subdivided bounding volumes of respective bounding volumes;
the process according to the invention, further comprises identifying one or more subdivided bounding volume intersecting the computed ray; and
the step of displaying the modeled objects comprises displaying a three dimensional representation of said modeled objects, said representation being user-selectable to edit said object The invention further proposes an apparatus for selecting an object in a PLM database containing modeled objects, the apparatus comprising means for implementing the steps of the process according to the invention.

The invention still concerns a computer program, stored on a computer readable medium, for selecting an object in a PLM database containing modeled objects, comprising code means for causing a computer to take the steps of the process according to the invention.

BRIEF DESCRIPTION OF THE DRAWINGS

A system embodying the invention will now be described, by way of non-limiting example, and in reference to the accompanying drawings, wherein.

DETAILED DESCRIPTION

The invention is directed to a process for displaying objects of a PLM database. A PLM database containing modeled objects and a graphical user interface are provided. A viewpoint on a view of objects to be rendered is identified. Then, the view is rendered according to the viewpoint. The step of rendering comprises determining a plurality of locations in the view, which are for example obtained according to a grid. Next, the database is searched and modeled objects are identified according to said locations. Meanwhile, the modeled objects identified are incrementally displayed in the graphical user interface so as to render the view—preferably a three dimensional view.

Incrementally displaying the objects identified, instead of displaying all at once, allows for a progressive and thus more reactive display: objects can be displayed, roughly or partially, their representation being partially loaded in the client memory.

Moreover, since the objects are identified according locations determined in the view, the more visible on the surface on the screen, the greater chance they have to be determined first. Hence, the most visible objects are displayed first, smaller objects (as seen on the screen) are displayed later. The display thus appears more relevant to the user. In addition and advantageously, objects which are entirely hidden are not found and thus need not be loaded in memory. The steps of identifying objects and incremental display can possibly be interlaced, for an even more efficient display.

The proposed solution allows for a rapid display of the view. Yet, since "individual" modeled objects are displayed, it is possible to individually select such objects once displayed in the view and, if needed, to load the selected object with its associated data in the session (design, navigation, viewing . . . ), for example through a single mouse-click.

Concerning identification of objects according to the determined locations: use is for example made of bounding volumes, stored in the PLM database. This will be explained in reference to FIG. 2-4, via an example wherein only one particular location in the view is considered (which amounts to perform a so-called "pick query" in the database). The global process according to the invention, which relies on a plurality of locations determined in the view, will be more particularly exemplified in reference to FIGS. 5a-h.

Figure 1:
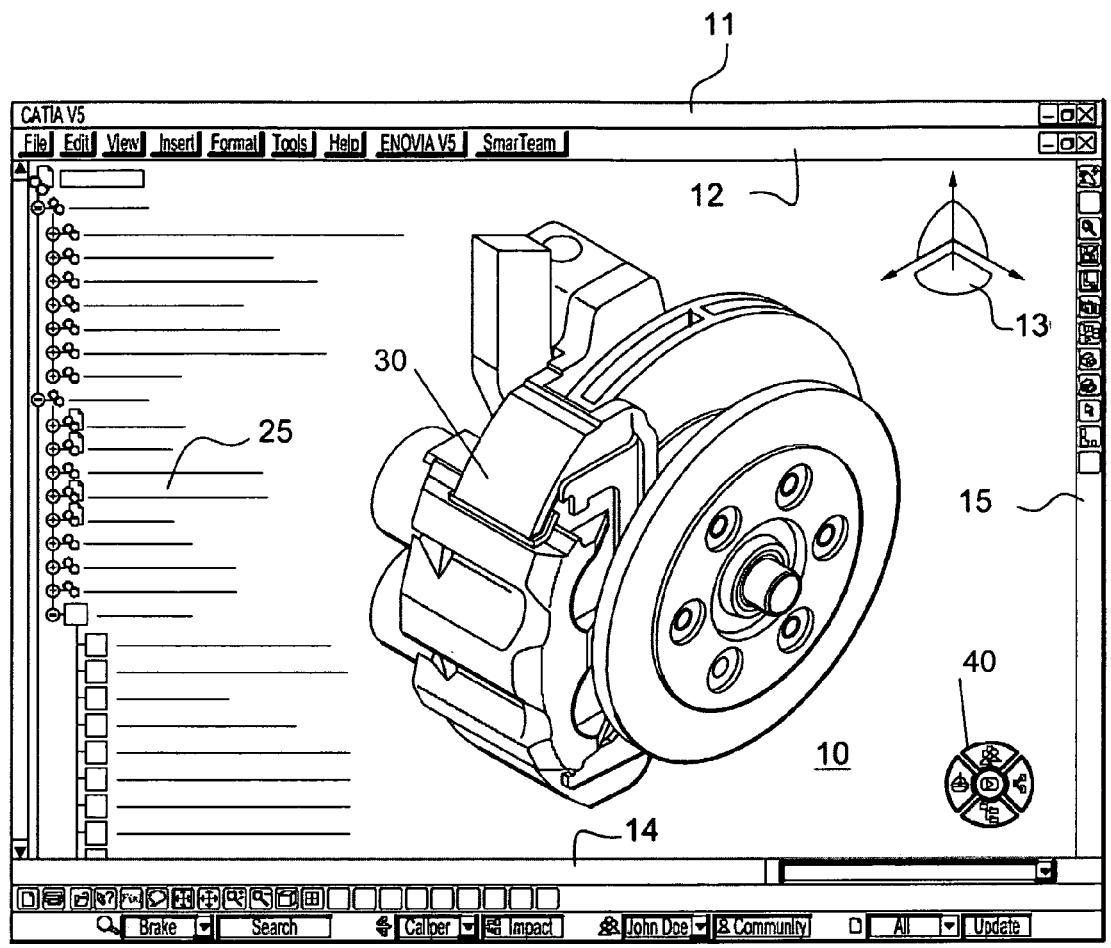
FIG. 1 is an exemplified display of a CAD-like graphical user interface.

In reference to FIG. 1, it is provided a graphical user interface with a user-controlled pointer, for example a mouse.

The graphical user interface (or GUI) 10 may be a typical CAD/CAM/CAE-like interface, having standard menu bars 11, 12, as well as bottom and side toolbars 14, 15. Such menu- and toolbars contain a set of user-selectable icons, each icon being associated with one or more operations or functions, as known in the art.

Some of these icons are associated with software tools, adapted for editing and/or working on a modeled object 30 such as that displayed in the GUI 10. The software tools in question may be grouped into workbenches. Otherwise put, each workbench comprises a different subset of software tools. In particular, one of these is an edition workbench, suitable for editing geometrical features of the modeled object 30. In operation, a designer may for example pre-select a part of the object 30 and then initiate an operation (e.g. change the dimensions or any attributes, etc.) by selecting an appropriate icon. For example, typical CAD operations are the modeling of the punching or the folding of a 3D modeled object displayed on the screen.

The GUI may for example display data 25 related to the displayed object 30. In the example of FIG. 1, the data 25, displayed as a "feature tree", and their 3D representation 30 pertain to a brake assembly including brake caliper and disc. The GUI may further show various types of graphic tool 13,40, for example for facilitating 3D orientation of the object, for triggering a simulation of an operation of an edited product or render various attributes of the displayed product 30.

As an example of embodiment, the process of the invention is implemented in a computer network comprising user computers and a product data management (PDM) system. The user computers are in communication through the PDM system, allowing for the management of numerous documents, relations and data, possibly hierarchically interrelated. The PDM system may for example be located at a backbone of the network. Such a PDM system utilizes a database having data related to modeled objects, which are likely to be edited by a designer. A plurality of users may thus work in a collaborative way, on different objects (for example parts, products or assemblies of parts).

Besides, the GUI 10 and associated CAD/CAM/CAE application may be designed for allowing access to the PLM database, either on users request or as a background task, in contrast with existing CAD/CAM/CAE interfaces. Thus, in operation, a user who wishes to access the database does not have to pass from a first CAD window to a PDM window (for example by minimizing the first window and maximizing the second window) and then go back to the CAD window. Such window switching operations, frequently carried out by designers, are time consuming and particularly inappropriate in the field of CAD/CAM/CAE.

The GUI 10 is run on one user computer of the network, having a display and memory. For instance, GUIs similar to that identified by reference numeral 10 displayed in FIG. 1 may be run on other user computers of the network. These computers may further benefit from similar local CAD/CAM/CAE applications and, more generally, a common environment.

Figure 2:
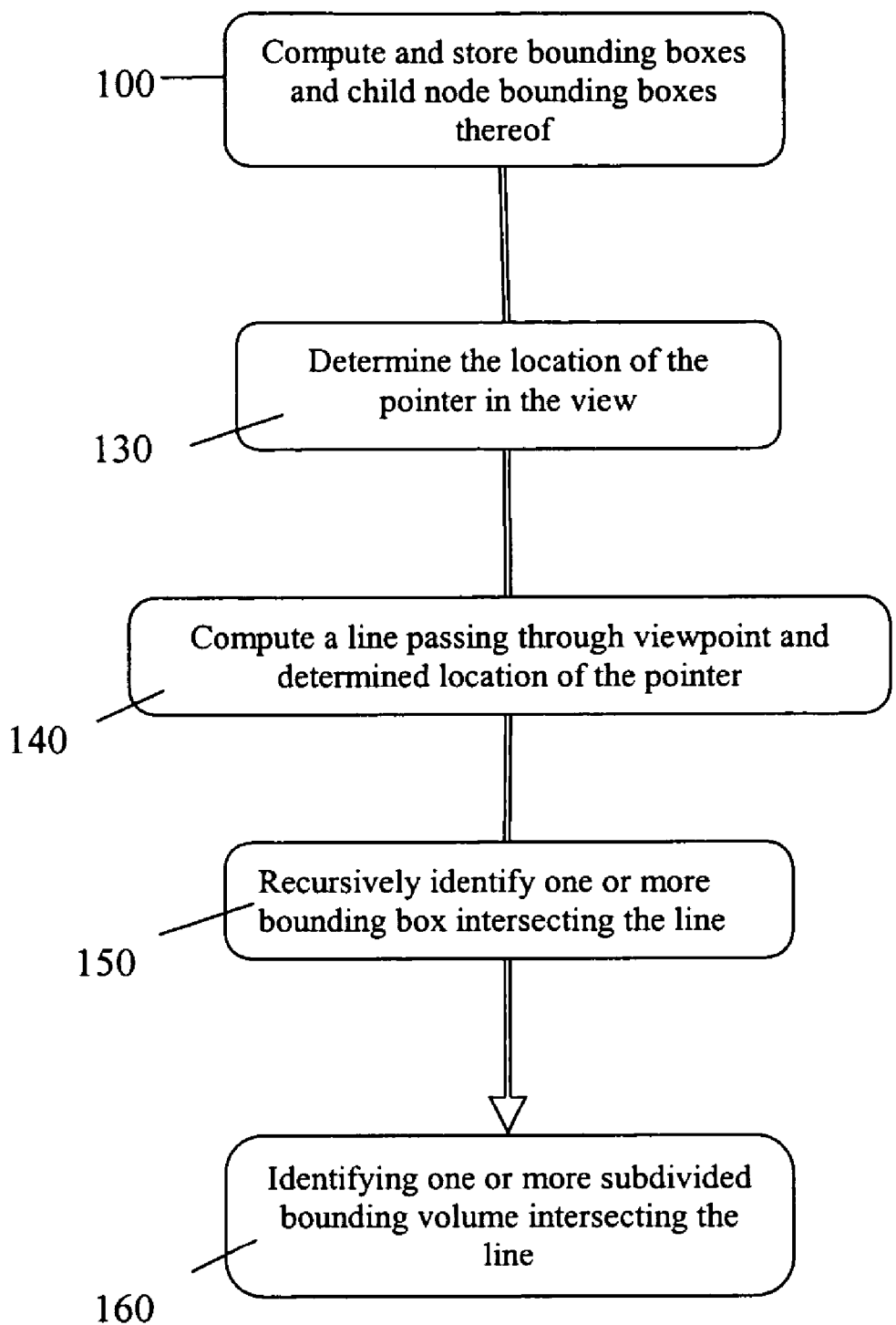
FIG. 2 shows a flowchart reflecting underlying steps of the process of the invention.

Referring now to FIG. 2, the process broadly decomposes as a build time (step 100) and a run time (steps 130-160). The build time may notably comprise a pre-processing step 100, mainly dedicated to bounding volumes computation and, possibly, to the creation of an index of the objects.

By "bounding volume", or bounding boxes, it is meant any mathematically simpler surface enclosing an object, for example for the purposes of culling or intersection tests. Typical bounding volumes are for example cubes, cylinder boxes or spheres. Use is made of bounding boxes in the following.

Bounding boxes of respective objects to be displayed are computed and subsequently stored in the PLM database. Such bounding boxes are stored together with a relation to their corresponding object. Geometric definitions of objects can be used to compute said boxes. The definitions used may either be the complete definitions or simplified definitions, such as the definitions of tessellated representations of said objects.

Preferably, one uses definitions of tessellated representations, which gives rise to faster computation times.

Considering a product as a hierarchy of objects, e.g. a tree, it is for example first computed boxes pertaining to terminal nodes of the tree. Product structure definitions are then used to compute (step 100) the assembly boxes, thanks to the definition of the structure and the terminal boxes already generated.

Furthermore, subdivided boxes are computed and stored in the database, together with respective parent bounding boxes. Parent bounding boxes are in this case the parent nodes of an octree, that is, a tree data structure wherein each parent node has eight child nodes, which together partition the volume of space of the parent node. Thus, each node of the tree represents a cuboid volume, e.g. a subdivided bounding volume. Several subdivisions can be contemplated (parents, children, children's children, etc.), depending on the desired resolution.

Moreover, only one bounding box is preferably stored for multi-instantiated objects of the set of objects. That is, bounding boxes are computed for the references only. In this case, instances of a same reference are likely to be stored together with a position matrix (or a link thereto). Hence, in operation, a box may be equated on-the-fly to any of the multi-instantiated objects upon a simple Cartesian system change.

Regarding the identification of objects, the process comprises a step of determining a plurality of locations in the view. Said locations may for instance be determined from a grid defined in the view, as will be detailed later. In the following, the process according to the invention is first described using a single location determined in the view.

First, at step 130, a location is determined in the view, e.g. a particular x,y location in the screen. Any known convenient method can be used to carry out step 130.

Next, at steps 140-160, the system proceeds to search the database and identifies to the user one object according to the determined location. Such steps are detailed now, according to some specific embodiments of the invention.

First, at step 140, it is computed a ray or any geometrical equivalent passing through a viewpoint of the view and the determined (x,y) location in the screen. Here the viewpoint depends on the perspective choice used for the representation, in a 3D context. It may be the vanishing or camera station point, as known in the art, or any other type of perspective.

Next, at step 150, it is identified one or more bounding boxes of a respective object of the set of objects, intersecting the computed ray. To this aim, several known techniques might be used to determine whether an intersection exists or not. For example, thanks to the viewpoint and the location first determined on the screen, it may be determined whether the ray intersects a bounding box.

In a brute force method, the algorithm may for example scan all bounding boxes corresponding to each child instance of the reference view, in order to determine which boxes intersect said computed ray. This step is carried out in the coordinate system of the reference view.

However, the above scan step becomes rapidly prohibitive as the number of objects increases. For example, CAD/CAM modeling of a modern airplane may require storing up to 3 millions boxes. Hence, one understands that it would be advantageous to speed up the intersection research algorithm.

In this respect, one may for example use the so-called R-tree technique, that is, a spatial access method, wherein space is split with hierarchically nested, possibly overlapping, boxes. Such a technique leads to more balanced trees according to various possible criteria, leading to more efficient scans.

Next, once an intersection with a child instance of the reference view has been found, the initial ray is recomputed in the coordinate system of said intersected child instance and a new scan is performed within child instances thereof, etc. until no more intersection is found.

Figure 3A:
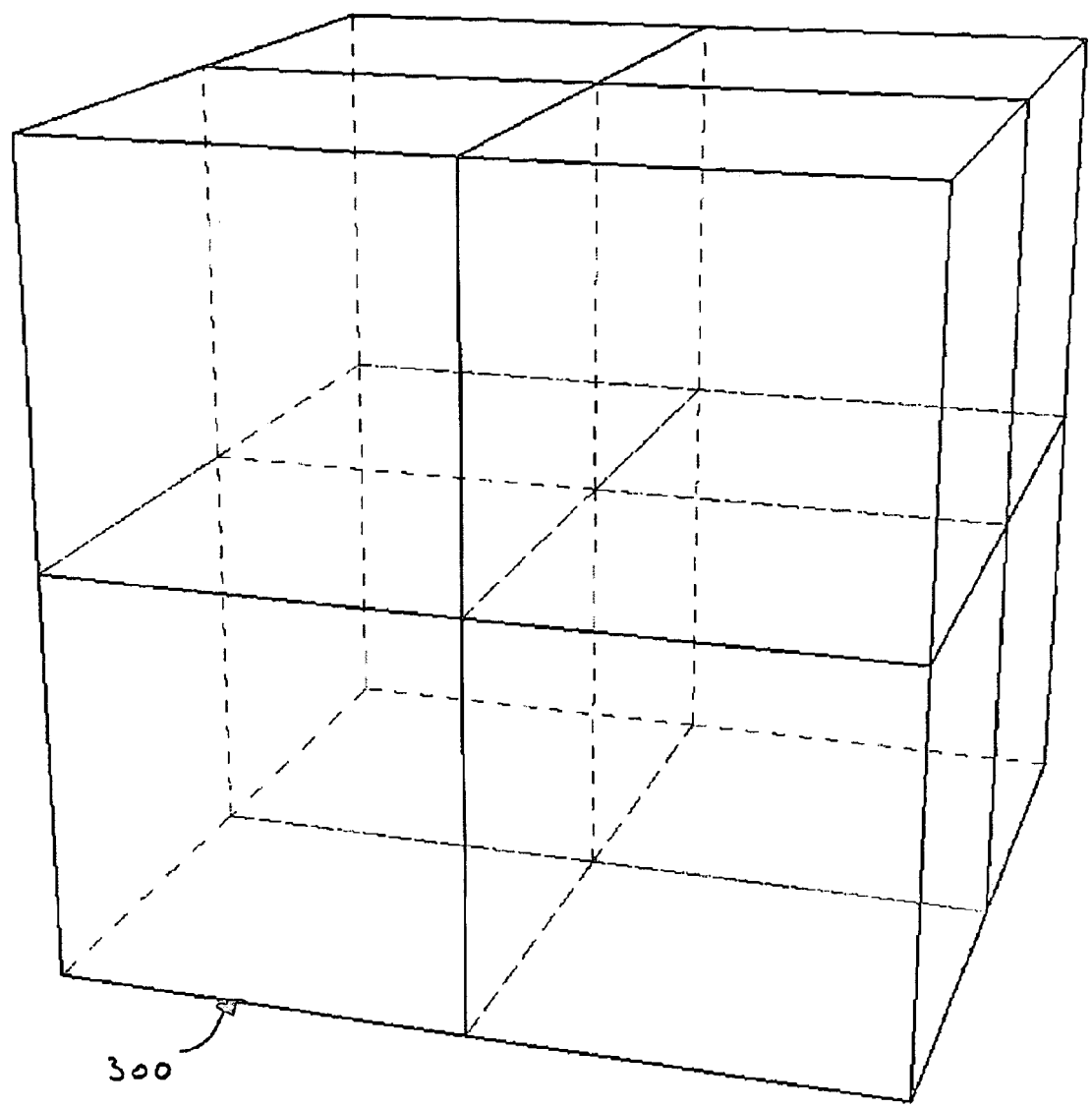
FIGS. 3a and 3b show an octree used in the process according to an embodiment of the invention.

The intersection research algorithm is thus recursive (steps 150-160), that is, it is searched the last intersected child of an $n^{th}$-order intersected parent box, and runs as follows:

Once an intersecting bounding box is detected, the process according to one embodiment works at a smaller subdivision level within the intersected bounding box. For example, one may consider the octrees, which are volumes dividing in eight a cubic box as shown in FIG. 3a.

Figure 3B:
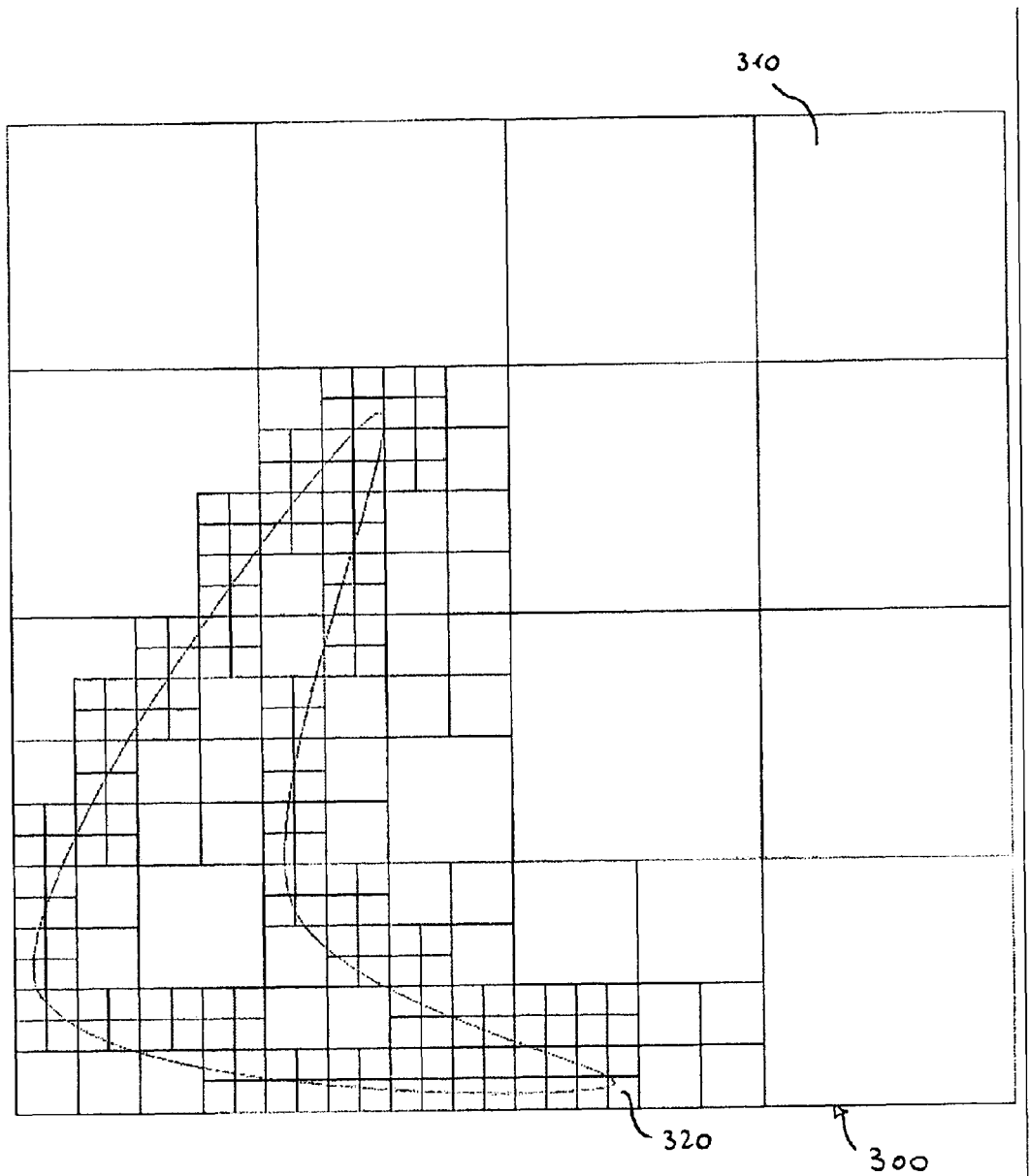

Octrees 300 are themselves for example further subdivided, as shown in FIG. 3b (represented in two dimension for the sake of clarity) except if an octree 310 does not contain any element of a model or is completely filled with an element of a model. Each octree 300 containing an element of the model is further subdivided.

The octrees 300 are therefore scanned to detect any intersection with the computed ray, until the smallest undivided volume, known as a voxel 320 (which size may for instance depend on the definition input by the user). The process then stops and the object in the view that is inside (or close to) the identified voxel is selected.

Once an object is selected, the distance of the corresponding voxel to the viewpoint is stored. Then, the process recursively tests other bounding boxes (steps 150-160) according to the same steps (bounding boxes, octrees, voxels) to find and select the object that would be the closest to the viewpoint along the ray. In order to optimize the process, if a bounding box does not intersect the computed ray (in the new coordinate system), then this bounding box is discarded. Similarly, if a bounding box is intersected by the ray but if, meanwhile, the distance between that bounding box and the viewpoint is greater than the previously stored distance, then said bounding box will not be further tested.

Once all the bounding boxes have been tested and an object been identified in the database, a representation of said object may be loaded from the database and displayed. Said representation may be a simplified or an exact representation such as an exact tessellated representation or a NURBS representation. How the loading and subsequent display interlace will be further described later.

Said selected object may for example be displayed using real attributes (color, texture, material . . . ). Additionally, other retrieved information may be displayed near the identified part or in the feature tree (see FIG. 1), such as its name, owner, or any other attributes.

Figure 4:
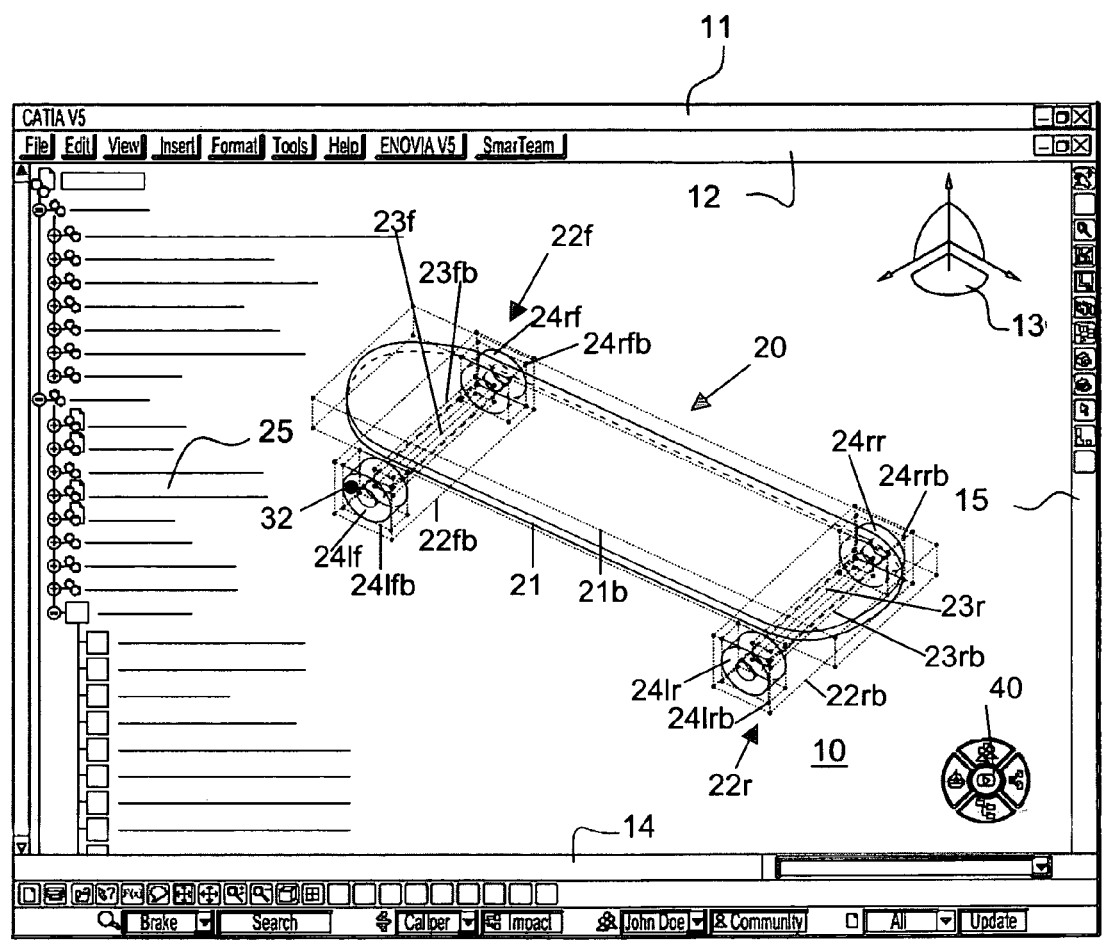
FIG. 4 shows a view of a set of objects displayed in the graphical user interface of FIG. 1, which can be identified according to an embodiment of the invention.

An embodiment of the above algorithm will be illustrated now, in reference to FIG. 4, showing a modeled object to be displayed in the same graphical user interface as in FIG. 1. Notice that bounding boxes are depicted in dotted lines in FIG. 4, as a guide for the eyes only.

Here the GUI 10 has menu and toolbars similar to those already described in reference to FIG. 1. In the GUI 10, a view of objects 21-24 to be rendered is represented. One should however keep in mind that at the very beginning of the process, none of the objects is actually displayed yet. Said view shows a skateboard 20, composed of a board 21, a front (f) and rear (r) trucks 22f, 22r. The trucks comprise respective shafts 23f, 23r and left (l) and right (r) wheels 24lf, 24rf, 24lr, 24rr ("lf" is for left-front, "rf" for right-front, etc.). Respective bounding boxes (b) are depicted under similar references 21b, 22fb, 22rb, 23fb, 23rb, 24lfb, 24rfb, 24lrb and 24rrb. In particular, some of the boxes correspond to terminal nodes, e.g. a wheel, a shaft and the board while other boxes correspond to some assemblies of parts (for example the trucks). Said boxes are computed according to product structure definitions, as explained above, preferably during a build-time process.

In operation, a grid is defined, which notably includes a reference point 32, whose location is determined from the grid definition. Said point 32 is, in this example, located in the screen at a location which fortuitously corresponds to the left-front wheel 24lf of the skate board.

Then, according to the method, a query in the database is triggered. A ray passing through the viewpoint and the location of the point 32 is computed as described above. All child instances of the set 20 forming the skateboard are then scanned. Since, in this example, an intersection is found with box 22fb (corresponding to the front truck 22f), the routine continues, switching to the system coordinate of box 22f. Non-intersected boxes are discarded.

Next, owing e.g. to an "is composed of" relation, it is then tested whether said ray intersects any of the boxes 23fb, 24rfb and 24lfb. An intersection is found with boxes 23fb and 24lfb, that is, corresponding to the front shaft, e.g. an instance of the reference "shaft", and left wheel, e.g. an instance of the reference "wheel". The hierarchical descent then stops as no more instance is found to compose the intersected instance. Next, the routine compares respective distances to the viewpoint and, provided accuracy criteria are met, finally returns the wheel 24lf as a part to be displayed. According to the invention, the system then retrieves from the database a representation of said part and possibly some or all data associated to the selected part.

Notice that, owing to the product structure definitions stored in the database, the result of the query is an occurrence, that is, an instance path. In this respect, in the previous example, the result of the query is not simply the front left wheel 24lf but rather the "left wheel" instance of the reference "wheel", in the "front truck" instance of the reference "truck".

Note that, in an embodiment, selecting (for example by simply clicking) an identified part subsequent to its display may open an edition window, with the selected part rendered therein, ready for edition.

In another embodiment, one may contemplate executing an "add" command in order to add the selected part in an editing window already open, or adding the selected part to a viewing session or the like.

Thus, the process described in reference to FIG. 2 can be seen as a pre-selection method, and the final selection of the object is only carried out upon activation of a user pointer pointing at the displayed object.

The example of FIG. 4 is obviously very simple, for the purpose of understanding. However, referring back to the flowchart of FIG. 2, in case of several bounding boxes are found, additional schemes may possibly be implemented to clearly distinguish boxes. In particular, if several voxels are found to intersect the ray, then the closest to the viewpoint would be identified as the one to be selected, etc.

Hence, this process allows to retrieve an object such as a part, possibly ready for edition, from the database. Only a correspondence between the point location and the part is required; the part may thus be quickly retrieved. As a result, the part may be loaded for display. Such an approach is further highly scalable, so that access to 3D data in 3D navigation on a light device (personal computers) becomes possible.

In an embodiment, new queries in the database will be triggered each time the viewpoint is changed.

Underlying steps of the process have been described above with respect to a single location determined in the view. The process is now described in reference to FIG. 5a-h, illustrating steps occurring at the run-time, wherein a plurality of locations are used.

As described above, the process may decompose as a build-time and a run-time. Typically, an index of the product is build (forming relations between the objects) and bounding boxes are stored during the build-time, for efficiency of the process, see FIG. 4. A duplication of some PLM data may be used for enabling faster 3D searches. Said duplication is preferably isomorphic to the stored PLM model.

Note that, in a variant, there is however no need to generate one index per product configuration stored in the database as filtering can be done at runtime.

FIGS. 5a-h illustrates more particularly the run-time.

Figure 5A:
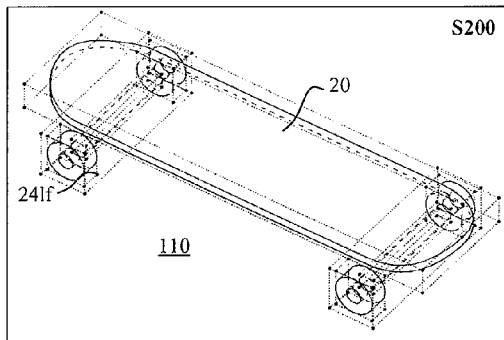
FIG. 5a-h shows a sequence of views reflecting steps of a process for displaying objects of a PLM database, according to an embodiment of the invention.

In reference to FIG. 5a: a view 110 of objects to be rendered is depicted, for the sake of the explanation to come. Said objects are not yet displayed. Details of the GUI are skipped for clarity. The set of objects and objects correspond to set 20 and objects 21-24 described in reference to FIG. 4. Said objects are further depicted with respective bounding boxes. References are also omitted for clarity. FIG. 5a illustrates step S200, at which a viewpoint on said view to be rendered is identified. The viewpoint can be dynamically defined (that is, real-time modified) by a user. Virtual camera is thereby made possible.

Figure 5E:
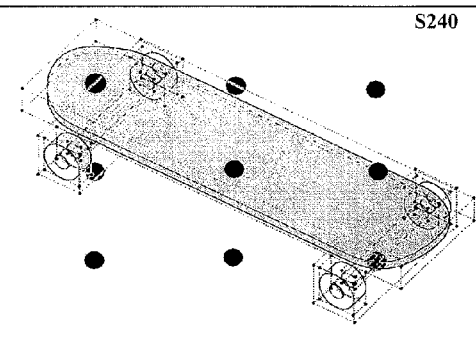
Figure 5B:
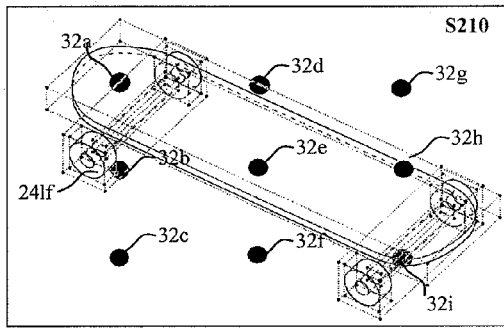

Next, at step S210 and in reference to FIG. 5b, a plurality of locations 32a-i is determined in the view. As said above, said locations can be determined from a grid, itself defined in the view. The process, when using a grid, will therefore hereafter be referred to as a grid scan process. Furthermore, determining said locations can be performed dynamically, according to a possibly dynamical definition of the viewpoint.

From the current viewpoint, a list of rays between the eye and e.g. a set of screen pixels corresponding to the grid is computed. Said rays are then treated according to steps described above. Using a terminology of the skilled person, a loop of pick queries is thus performed.

From the grid visible in FIG. 5b, searching the database allows for concluding that some of the point locations pertain to the board (reference 21 in FIG. 4) as they meet its corresponding bounding box. These are points 32a, 32d, 32e, 32h and 32i (hence a total of five counts). Another point 32b pertains to the left front wheel (see references 23lf in FIG. 4). Therefore, upon completion of a first scan, relevant parts are identified and a list thereof is returned from e.g. a PLM server linked to the database.

Figure 5F:
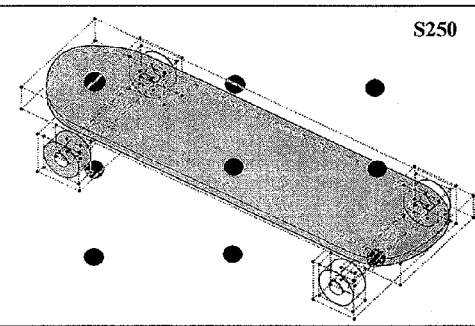
Figure 5C:
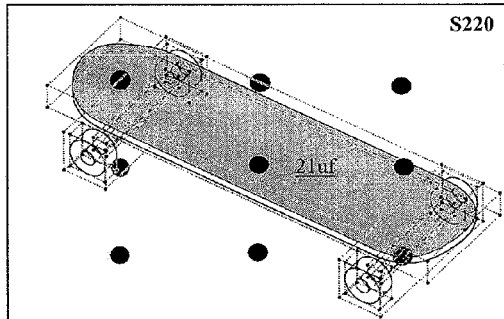
Figure 5G:
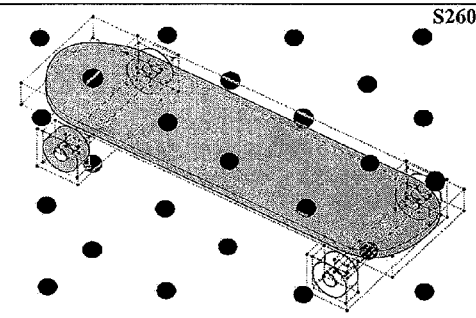
Figure 5D:
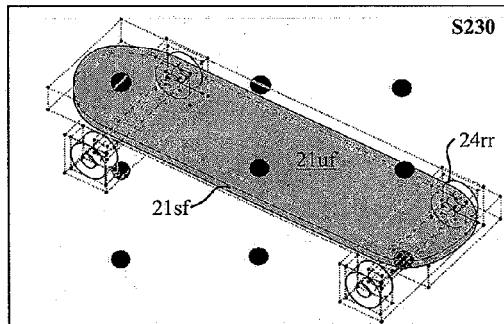

Next, in reference to FIGS. 5c-d, a display routine is begun. Modeled objects are incrementally displayed, which allows for immediate display in the view. Furthermore, as said above, the bigger the object, the greater chance it has to meet a point of the grid. Therefore, most visible objects are displayed first. In this example, the board is unsurprisingly identified for a subsequent display.

Yet, the front left wheel was also identified, which is actually not the most visible object under the current viewpoint. Therefore, the grid scan process may possibly be improved by establishing a ranking of the objects identified, for example:

Board: five counts;
left front wheel: one count.

Only the statistics relative to terminal leaves are used. However, in a variant, statistics relative to parent nodes may possibly be taken into account, e.g. as the front left wheel is a child of the front truck, one may impart one count to the front truck as well.

Hence, preferably, the order in displaying said objects is computed according to the above ranking, so as to ensure that the most visible object, e.g. the board, will indeed be displayed first.

In an embodiment, the PLM database further stores display components of the modeled objects. The rendering step may hence comprise streaming display components of the modeled objects identified. Accordingly, the display components would be incrementally displayed (S220-S230). Streaming components can run in background.

Said display components may consist in different components (like different faces) of a same part, as illustrated from FIG. 5c to 5d. In FIG. 5c: The upper face 21uf of the board is displayed first. In FIG. 5d: a side face 21sf is subsequently displayed.

Preferably, the components in question are loaded incrementally as a sequence of increasingly accurate sub-components, e.g. voxels, then low resolution triangles and finally accurate triangles. This allows for reducing I/O usage.

In a variant, steps of incrementally displaying objects and incrementally streaming/displaying object components are interlaced, for improving the rendering time. For example, a given number of objects are identified during a first scan. Displaying said objects begins by displaying voxels and then triangles. During a second scan, other objects are identified, while streaming previous components continues in background, etc.

Moreover, one may use some adaptative loading, depending on the current viewpoint. One may further make use of culling techniques (viewpoint culling, occlusion culling, pixel culling, . . . ). Furthermore, when viewpoint changes, additional loading or unload can be performed, so as to limit the peak memory usage.

FIGS. 5e-f: the left front wheel 24lf is now displayed, for instance according to an incremental streaming of components (in this example, an outer and then a side component of the left front wheel 24lf are sequentially displayed).

Figure 5H:
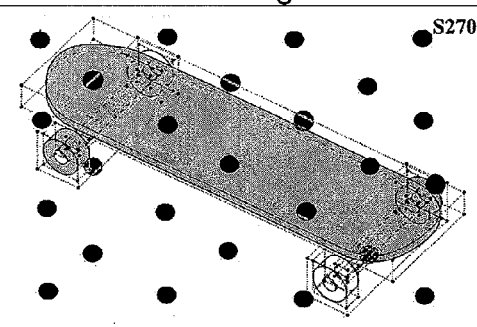

FIG. 5g-h: the step of determining the plurality of locations may possibly comprise a step of refining (S250-S260) the initial grid with time. Accordingly, a new grid is computed, new ray queries are performed (hence a new scan) and new count statistics are returned, resulting in displaying previously unloaded parts (as for instance the rear right wheel 24rr of the skate).

In addition, a variable grid resolution may be used, depending on local statistics for a screen area. This may help in improving the convergence of a screen scan.

Preferably also, the steps of identifying modeled objects (e.g. scan/ray queries) and incrementally displaying (e.g. 3D display) are performed alternatively on a time basis. For example: rays are computed during 300 ms (including the grid refinement) and cumulated results sent back. The time basis may even possibly scales according to a "speed" of viewpoint change. This allows for matching the part identification with a current viewpoint.

The grid resolution may hence sequentially be refined. Multiple screen scans are accordingly carried out, building a grid of tested pixels that refines with time. First scans quickly find the most visible objects.

The number of tested pixels typically grows as the square of grid resolution. Therefore, though the process described allows for an immediate display, the convergence is eventually slow. Furthermore, some of the objects which are smaller on the screen than the final grid resolution may not be returned.

Figure 6:
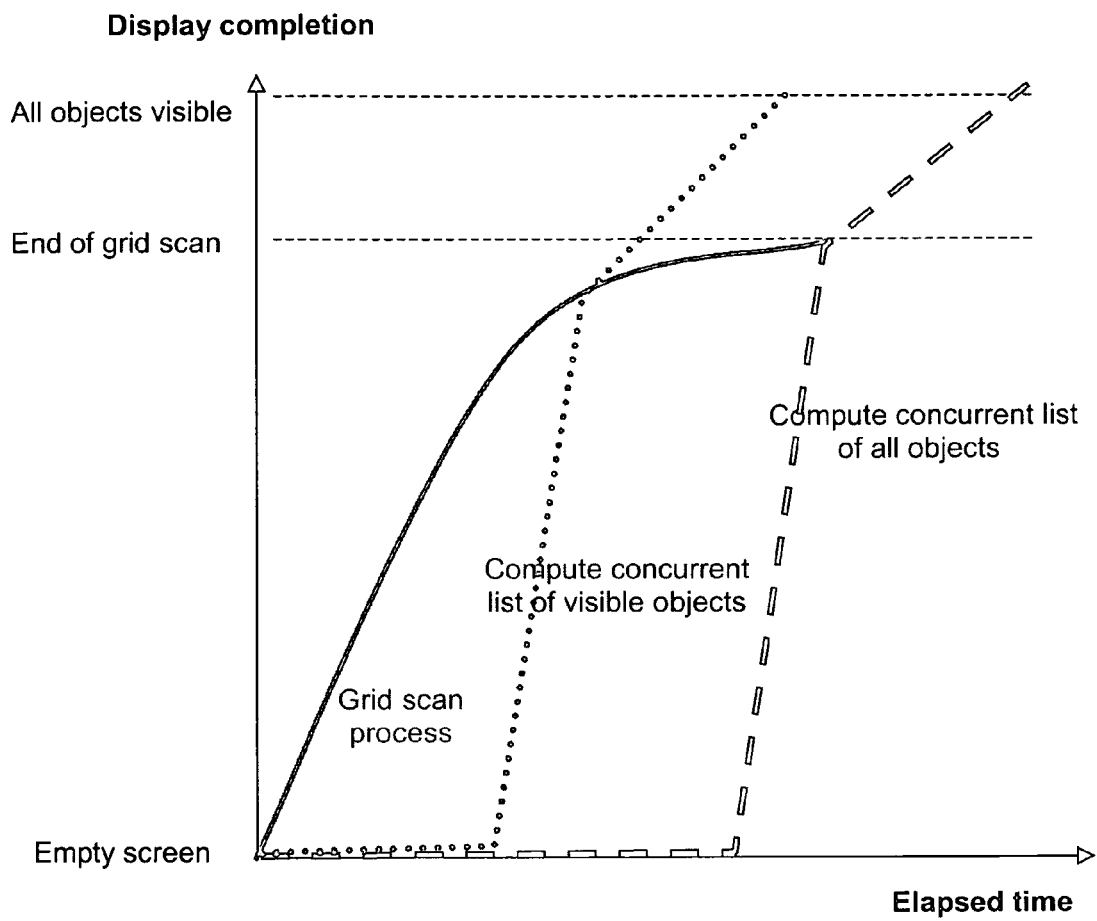
FIG. 6 compares the display completion as obtained with various methods, which may concurrently be implemented in the process, according to an embodiment of the invention.

This is illustrated in FIG. 6, comparing the display completion as a function of time, as obtained with various methods.

As shown, the grid scan process (full line) described above may discard some of the smaller parts (all the more if one uses a finite resolution): at the end of the grid scan, not all the parts are displayed. In contrast, processes known in the art (dotted and dashed lines) are likely to exhibit a slow start but finally allow for complete list retrieval.

Accordingly, in reference to FIG. 6, the above grid scan can be concurrently performed with one or more other queries that takes more time to start a display but returns a complete list of objects ultimately, if necessary restricted to the sole objects visible in the view.

In particular, the above process may include a (concurrent) step of identifying in the database a (concurrent) list of modeled objects. Once identified, visualization data of the objects can be loaded and conveniently stored, awaiting for display.

Furthermore, the incremental display would accordingly decompose as two complementary display sub-steps. In a first sub-step, the process display the modeled objects identified according to the determined locations, that is, according to the grid scan process described above. In a second sub-step, the display of the modeled objects is completed according to the concurrent list returned. It is thus possible to eventually display all the visible objects with an improved convergence. Note that when the process relative to the second sub-step completes, the process relative to the first one can be stopped as the concurrent list is completed.

The second sub-step may for instance simply consist in using a grid resolution depending on local statistics for a screen area, so as to improve the convergence of screen scan (as already evoked).

The second sub-step may also consist in a "viewpoint query" (e.g. all visible objects are identified in the concurrent list, with or without occlusion) or a query of type "expand all" (a brute list of all objects is returned). Such methods may e.g. allow for completion of the display without testing all screen pixels.

Concerning the viewpoint query: any known method which computes a full list of objects in the viewpoint (even hidden) can be contemplated. The list may possibly be restricted to the sole visible objects. This may allow for completion of the display with minimal I/O and memory usage.

As can be seen in FIG. 6, the known methods (dotted/dashed lines) have a slower start, compared with the grid scan process. Yet, at some crossing point, switching to one of the known methods allows for improving the convergence rate and, if necessary, for completing the display.

The invention is not limited to the preferred embodiments described above, in reference to the drawings. In particular: mixed representations may be contemplated when rendering the view in the GUI. Said view may for instance be partly non-associative as regards a particular set of objects. This may in particular apply for assemblies of part, allowing for a faster loading. In contrast, other objects could be loaded in the view with respective attributes allowing direct selection thereof. This would require a specific indexation of the product at the build-time. For example, a representation of some objects may comprise a set of hyperlinks to the database. Thus, clicking a suitable zone which corresponds to a hyperlink allows a respective part to be directly selected.

We claim:

1. A process for displaying objects of a product lifecycle management (PLM) database, comprising:
    providing a PLM database containing modeled objects and a graphical user interface;
    identifying a viewpoint on a view of objects to be rendered; and
    rendering said view according to the viewpoint, wherein the step of rendering comprises:
    determining a plurality of locations of points in the view;
    searching the database and identifying therein modeled objects that are intersected by at least one of a plurality of computed rays passing through the viewpoint and one of the determined locations; and
    incrementally displaying in the graphical user interface the identified modeled objects according to a ranking among the identified modeled objects, the ranking being based on a number of the computed rays intersecting each of the identified modeled objects.

2. The process of claim 1, further comprising, before the step of identifying the viewpoint, a step of:
    receiving dynamical definition of the viewpoint by a user, wherein
    the step of determining the plurality of locations of points is performed dynamically, according to the user definition of the viewpoint.

3. The process of claim 1, wherein the locations are determined from a grid defined in the view.

4. The process of claim 3, wherein the step of determining the plurality of locations of points comprises refining said grid with time.

5. The process of claim 1, wherein
    the PLM database further comprises display components of the modeled objects, and
    the step of rendering further comprises streaming display components of the modeled objects identified, and
    at the step of rendering, the step of incrementally displaying comprises incrementally displaying the display components.

6. The process of claim 1, wherein the steps of identifying modeled objects and incrementally displaying are performed alternatively on a time basis.

7. The process of claim 1, further comprising, parallel to the step of searching the database and identifying modeled objects, a step of identifying in the database a list of modeled objects visible in said view according to the viewpoint, wherein
    the step of incrementally displaying comprises displaying the modeled objects identified according to the determined locations, and completing the display of the modeled objects according to the list.

8. The process of claim 1, wherein the step of searching and identifying further comprises identifying one or more bounding volume of a respective modeled object intersecting each of the computed rays.

9. The process of claim 8, further comprising:
    identifying, amongst the objects corresponding to intersecting bounding volumes, the object the closest to the viewpoint.

10. The process of claim 8, further comprising, prior to the step of searching the database, a step of:
    computing and storing in the PLM database bounding volumes of respective modeled objects.

11. The process of claim 10, wherein at the step of computing and storing bounding volumes, only one bounding volume is stored for multi-instantiated objects of the modeled objects.

12. The process of claim 8, wherein the step of identifying one or more intersecting bounding volume is carried out recursively, based on relations stored in the database between the respective objects.

13. The process of claim 8, further comprising, prior to the step of searching the database:
   computing and storing in the PLM database subdivided bounding volumes of respective bounding volumes.

14. The process of claim 13, further comprising:
   identifying one or more subdivided bounding volume intersecting the computed ray.

15. The process of claim 1, wherein the step of displaying the modeled objects comprises displaying a three dimensional representation of said modeled objects, said representation being user-selectable to edit said object.

16. An apparatus for selecting an object in a PLM database containing modeled objects, the apparatus comprising a processor for implementing a process for displaying objects of a PLM database, the process comprising:
   providing a PLM database containing modeled objects and a graphical user interface;
   identifying a viewpoint on a view of objects to be rendered; and
   rendering said view according to the viewpoint, wherein the step of rendering comprises:
   determining a plurality of locations of points in the view;
   searching the database and identifying therein modeled objects that are intersected by at least one of a plurality of computed rays passing through the viewpoint and one of the determined locations; and
   incrementally displaying in the graphical user interface the identified modeled objects according to a ranking among the identified modeled objects, the ranking being based on a number of the computed rays intersecting each of the identified modeled objects.

17. A non-transitory computer-readable medium storing a computer program for selecting an object in a PLM database containing modeled objects, the program, when processed by a computer causing the computer to take the steps of a process for displaying objects of a PLM database, the process comprising:
   providing a PLM database containing modeled objects and a graphical user interface;
   identifying a viewpoint on a view of objects to be rendered; and
   rendering said view according to the viewpoint, wherein the step of rendering comprises:
   determining a plurality of locations of points in the view;
   searching the database and identifying therein modeled objects that are intersected by at least one of a plurality of computed rays passing through the viewpoint and one of the determined locations; and
   incrementally displaying in the graphical user interface the identified modeled objects according to a ranking among the identified modeled objects, the ranking being based on a number of the computed rays intersecting each of the identified modeled objects.

* * * * *